United States Patent
Wang

(10) Patent No.: US 7,324,029 B2
(45) Date of Patent: Jan. 29, 2008

(54) CAPACITANCE-TO-DIGITAL INTERFACE CIRCUIT FOR DIFFERENTIAL PRESSURE SENSOR

(75) Inventor: Rongtai Wang, Eden Prairie, MN (US)

(73) Assignee: Emerson Process Management, Eden Prairie, MN (US)

( * ) Notice: Subject to any disclaimer, the term of this patent is extended or adjusted under 35 U.S.C. 154(b) by 137 days.

(21) Appl. No.: 11/339,890

(22) Filed: Jan. 26, 2006

(65) Prior Publication Data
US 2007/0171107 A1    Jul. 26, 2007

(51) Int. Cl.
*H03M 3/00* (2006.01)

(52) U.S. Cl. .............. 341/143; 341/172; 324/658; 324/678; 324/679; 73/718; 73/724

(58) Field of Classification Search .......... 324/658
See application file for complete search history.

(56) References Cited

U.S. PATENT DOCUMENTS

| | | | | |
|---|---|---|---|---|
| 4,163,221 A | * | 7/1979 | Kosakowski | 341/172 |
| 4,878,012 A | * | 10/1989 | Schulte et al. | 324/658 |
| 5,057,839 A | * | 10/1991 | Koch | 341/143 |
| 5,159,341 A | * | 10/1992 | McCartney et al. | 341/143 |
| 5,323,158 A | * | 6/1994 | Ferguson, Jr. | 341/143 |
| 5,351,050 A | * | 9/1994 | Thompson et al. | 341/143 |
| 5,974,895 A | * | 11/1999 | Steger et al. | 73/769 |
| 5,990,578 A | * | 11/1999 | Krauss | 307/116 |
| 6,005,500 A | * | 12/1999 | Gaboury et al. | 341/143 |
| 6,140,952 A | * | 10/2000 | Gaboury | 341/143 |
| 6,172,630 B1 | * | 1/2001 | Nelson | 341/143 |
| 6,295,875 B1 | | 10/2001 | Frick et al. | |
| 6,356,085 B1 | * | 3/2002 | Ryat et al. | 324/658 |
| 6,509,746 B1 | * | 1/2003 | Wang | 324/678 |
| 6,516,672 B2 | | 2/2003 | Wang | |
| 6,684,711 B2 | | 2/2004 | Wang | |
| 6,768,319 B2 | | 7/2004 | Wang | |
| 6,834,258 B2 | | 12/2004 | Schulte et al. | |
| 6,873,277 B1 | | 3/2005 | Frick | |
| 6,970,126 B1 | * | 11/2005 | O'Dowd et al. | 341/172 |
| 2006/0213270 A1 | * | 9/2006 | O'Dowd et al. | 73/514.32 |

* cited by examiner

*Primary Examiner*—Khai M. Nguyen
(74) *Attorney, Agent, or Firm*—Kinney & Lange, P.A.

(57) ABSTRACT

A two phase, second order capacitance-to-digital (CD) modulator includes a first stage sigma-delta integrator that forms charge packets as a function of sensor capacitance during an auto-zero phase and integrates the packets during an integration phase to produce an output voltage. The first stage integrator holds its output voltage during the auto-zero phase, so that a second stage sigma-delta integrator can sample the first stage output voltage during the auto-zero phase and integrate the sampled voltage during the integration phase.

20 Claims, 13 Drawing Sheets

TIME (min)

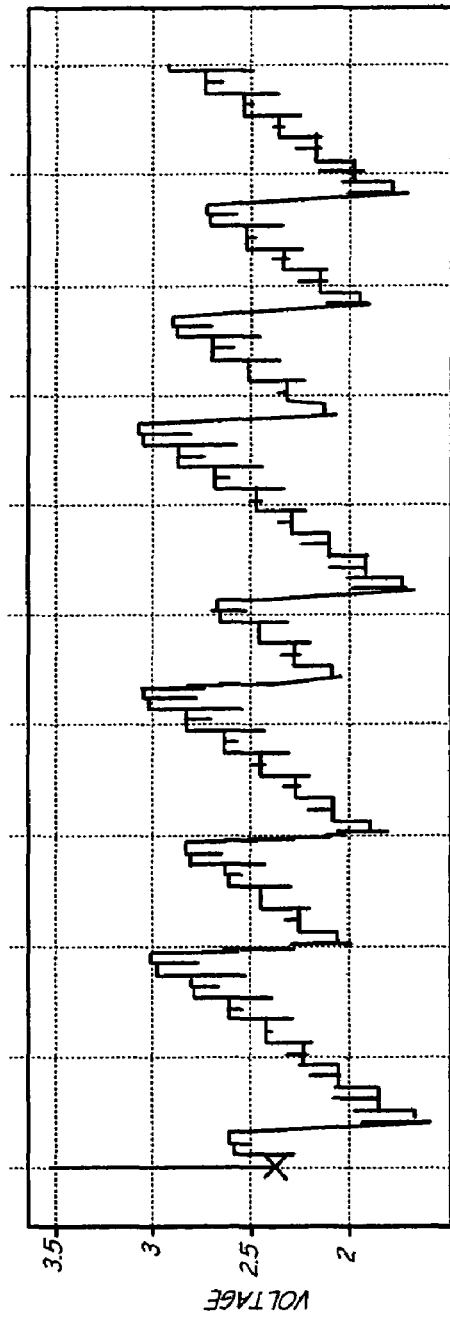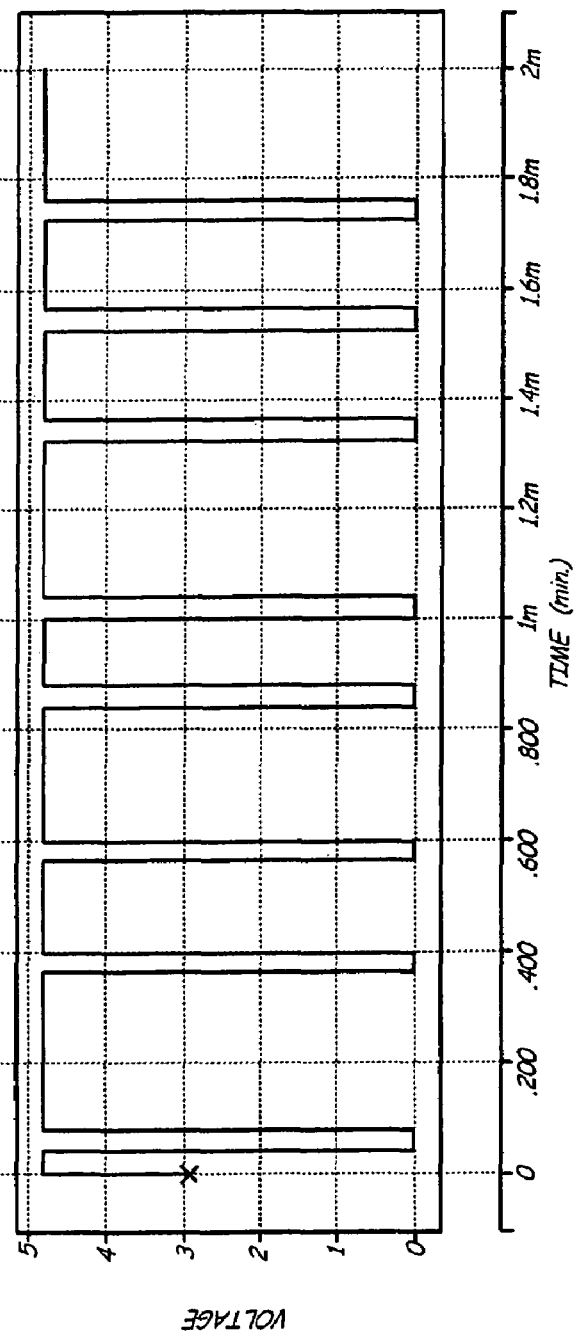

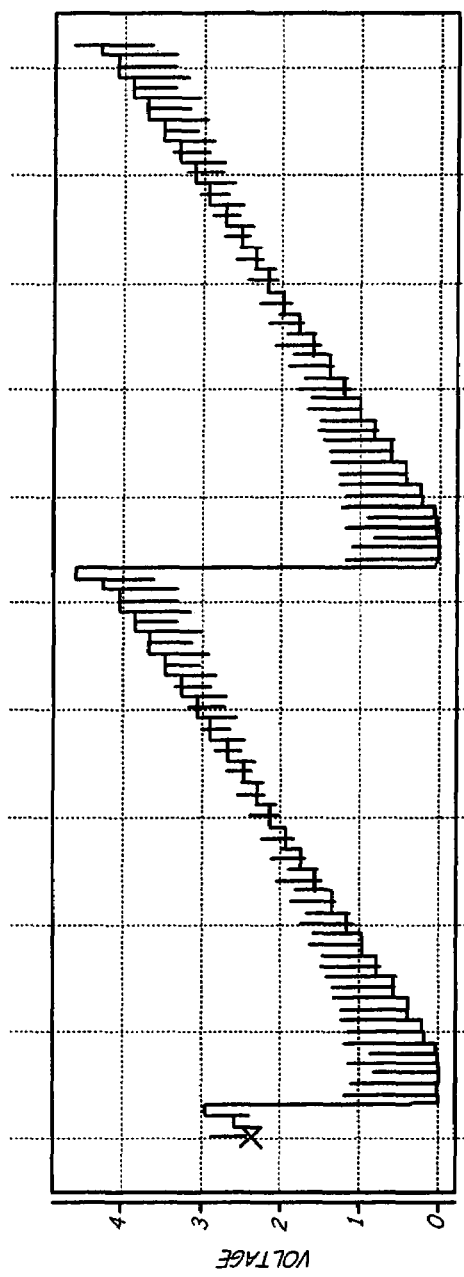

CAPACITANCE-TO-DIGITAL INTERFACE CIRCUIT FOR DIFFERENTIAL PRESSURE SENSOR

CROSS REFERENCE TO RELATED APPLICATION

Reference is made to a commonly assigned co-pending application filed on even date entitled "Fold-back Free Capacitance-to-Digital Modulator" Ser. No. 11/340,808.

BACKGROUND OF THE INVENTION

The present invention relates to a measurement system. In particular, the present invention relates to a capacitance-to-digital modulator for use with a capacitive differential pressure sensor.

A field transmitter is a device that is used to monitor the operation of an industrial process. The field transmitter includes a transducer that responds to a measured process variable with a sensing element and converts the variable to a standardized transmission signal that is a function of the measured variable. The term "process variable" refers to a physical or chemical state of matter or conversion of energy. Examples of process variables include pressure, temperature, flow, conductivity, and pH.

One such transmitter is described in U.S. Pat. No. 6,295,875 by Roger L. Frick and David A. Broden. This transmitter employs a capacitive sensor having a deflectable sensing diaphragm and three or more capacitor electrodes which form separate capacitive sensing elements with the diaphragm. Two of the capacitor elements are primary sensing capacitors that are arranged differentially so that the capacitances of the primary sensing capacitors charge oppositely in proportion to the process variable. The third and fourth capacitor elements are compensation capacitors that provide signals representing offset errors or hysteresis associated with the primary capacitors. As pressure is applied to one or both sides of the diaphragm, the diaphragm deflects. The deflection of the diaphragm can be detected by measuring a change in a ratio of electrical capacitance related to the deflection. This capacitance ratio is converted into a digital format using an analog-to-digital converter.

One particularly advantageous form of analog-to-digital converter uses a sigma-delta (or delta-sigma) modulator. The use of sigma-delta modulators in transmitters is described in U.S. Pat. No. 5,083,091 by Roger L. Frick and John P. Schulte; U.S. Pat. No. 6,140,952 by Michael Gaboury; U.S. Pat. No. 6,509,746 by Rongtai Wang; and U.S. Pat. No. 6,516,672 by Rongtai Wang.

In a transmitter having a sigma-delta modulator acting as a capacitance-to-digital (CD) converter, an excitation circuit provides charge packets to the capacitive sensor elements. The sensor elements are charged by an amount based on the capacitance value of that capacitive element. The charges are transferred to an integrator/amplifier of the sigma-delta modulator to produce a one-bit binary output which is a function of a capacitance ratio.

The basic function of the CD modulator is to convert the capacitance ratio into a PCM (pulse code modulation) signal. The capacitance ratio under measurement is defined as: $\eta=(C_X-C_Y)/(C_X+C_Y)$, where $C_X$ and $C_Y$ represent capacitance of two sensor capacitors with a common plate.

For a CD modulator using sigma-delta architecture, the actual process involves converting a charge ratio into a PCM signal. Under normal operating conditions, since the charge is proportional to the capacitance, the charge ratio is equal to the capacitance ratio.

However, this equivalent relation is not true under certain abnormal operating conditions. One such operating condition is overpressure in conjunction with a short circuit in one of the sensor capacitors. Due to the leakage caused by the short circuit, the charge that is transferred from the sensor capacitor may be very small. As a result of this, the digital reading provided by PCM signal is not equal to the capacitance ratio. Not only is the magnitude of the reading not correct, in many cases even the polarity of the reading is wrong. This kind of phenomena is called "fold-back anomaly". There is a need for improved circuitry that eliminates the fold-back anomaly.

BRIEF SUMMARY OF THE INVENTION

A second order capacitance-to-digital (CD) modulator includes first and second stage sigma-delta integrators which operate together in a two phase operation, in which a first phase is an auto-zero phase and a second phase is an integration phase. The first stage sigma-delta integrator is not reset during the auto-zero phase, so that the output of the first stage sigma-delta integrator can be sampled by a second stage sigma-delta integrator during the auto-zero phase and integrated during the integration phase.

Suppression of fold-back anomaly caused by a combined overpressure and short circuit condition is provided by an auto-zero capacitor of the first stage sigma-delta integrator. The auto-zero capacitor stores a voltage that is a function of leakage resistance of a sensor capacitor during each auto-zero phase.

A BRIEF DESCRIPTION OF THE DRAWINGS

FIGS. 12A and 12B show waveforms of first stage output voltage $V_{OUT1}$ and pressure signal PCMP from a computer simulation of overpressure/short circuit operation of a CD modulator without anti-foldback circuitry.

FIGS. 13A and 13B show waveforms of first stage output voltage $V_{OUT1}$ and pressure signal PCMP from a computer simulation of overpressure/short circuit operation of a CD modulator including the first stage integrator of FIG. 9.

DETAILED DESCRIPTION

Figure 1:
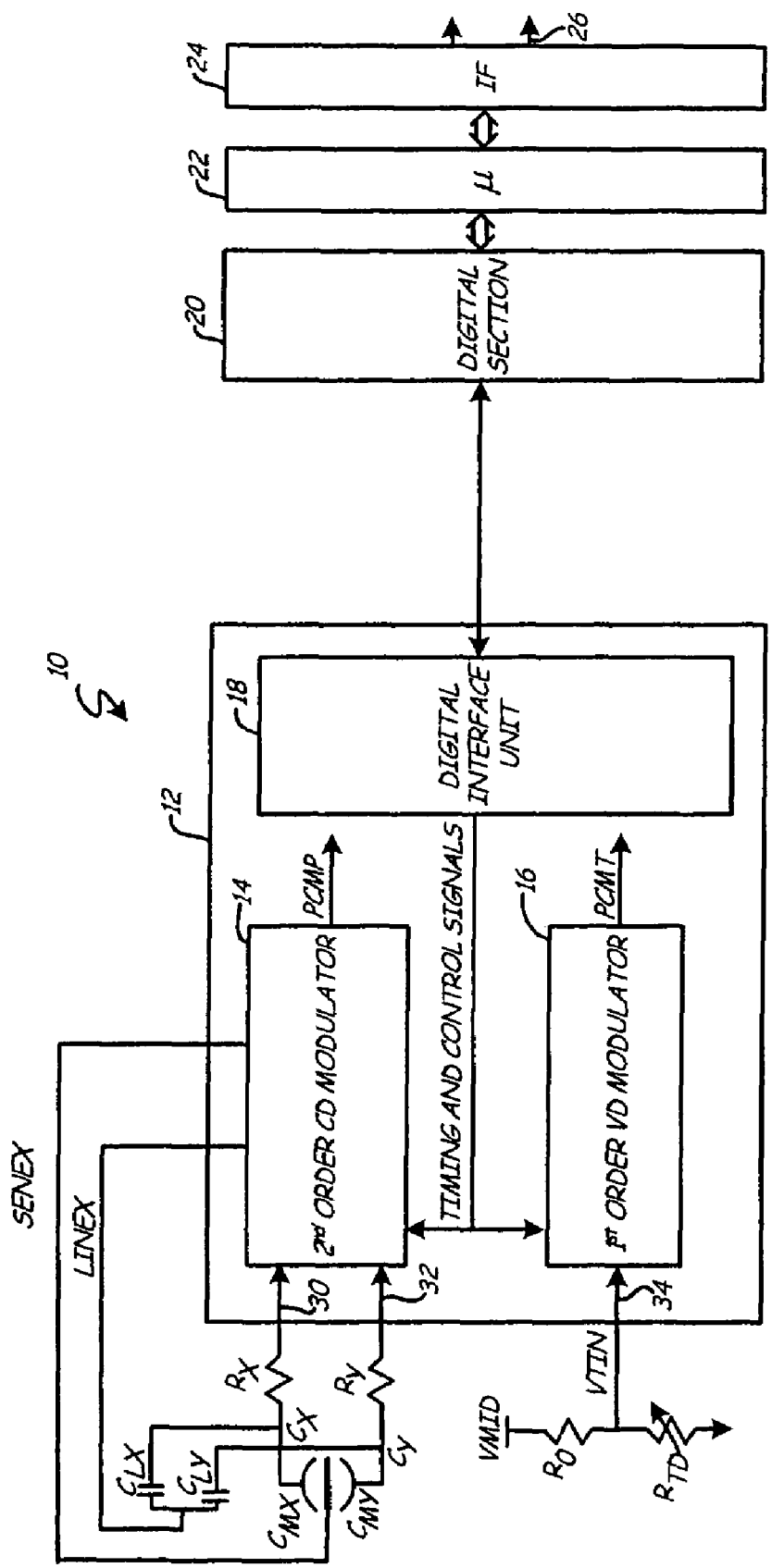
FIG. 1 is a block diagram of a differential pressure transmitter.

FIG. 1 shows pressure transmitter 10, which is a capacitance-based differential pressure transmitter that includes main sensor capacitors $C_{MX}$ and $C_{MY}$, linear compensation capacitors $C_{LX}$ and $C_{LY}$, resistors $R_X$ and $R_Y$, analog section 12 (which includes second order capacitance to digital (CD) modulator 14, first order voltage to digital (VD) modulator 16, and digital interface unit 18), digital section 20, microprocessor 22, and interface 24. Communication between transmitter 10 and a control room is provided through interface 24. The communication may be through a two-wire loop or network over which analog, digital, or a combination of analog and digital signals are transmitted, or may be via wireless transmission.

Analog section 12 and digital section 20 may be incorporated in a mixed signal application specific integrated circuit (ASIC) chip. Digital interface unit 18 of analog section 12 receives digital clock signals and other control signals from digital section 20. Digital interface unit 18 provides a level shift function between the signal levels required for digital section 20 and those required for analog section 12. It also generates timing signals and other control signals for CD modulator 14 and VD modulator 16.

The timing signals provided by digital interface unit 18 include zero phase signals Z and ZD, integration phase signals I and ID, quantizer timing signals SCK and DCK, and a reset signal.

Second order CD modulator 14 is a sigma-delta converter that receives capacitance inputs $C_X$ and $C_Y$ at input nodes 30 and 32 and produces a pulse code modulation pressure (PCMP) signal that is a function of the difference of capacitances $C_X$ and $C_Y$ divided by the sum of capacitances $C_X$ and $C_Y$. CD modulator 14 receives timing and control signals from digital interface unit 18 and generates excitation signals SENEX and LINEX.

Components $C_{MX}$ and $C_{MY}$ represent the sensor capacitors, with their common plate connected to receive sensor excitation signal SENEX. Components $C_{LX}$ and $C_{LY}$ are linear compensation capacitors having their common plate connected to a linearization excitation signal LINEX.

Input capacitances $C_X$ and $C_Y$ are defined as:

$$C_X = C_{MX} - C_{LX}$$

$$C_Y = C_{MY} - C_{LY}$$

The differential capacitance ratio $\eta_P$ is:

$$\eta_P = \frac{C_X - C_Y}{C_X + C_Y}$$

The transfer function for CD modulator 14 is:

$$\eta_P = 2 \cdot D_P - 1$$

where $D_P$ is the pulse density of PCMP signal. For normal operation, the dynamic range of the ratio $\eta_P$ is:

$$-0.8 \leq \eta_P \leq 0.8,$$

where $C_X$ and $C_Y$ can each reach a maximum effective capacitance of about 100 pF. CD modulator 14 must be fold-back free in the case of overpressure with a short circuit.

VD modulator 16 is a first order sigma-delta converter or integrator which receives a voltage input VTIN from the voltage divider performed by resistor $R_O$ and temperature sensing resistor $R_{TD}$ at its input node 34. The output of VD modulator 16 is a pulse code modulation temperature (PCMT) signal.

The PCMP and PCMT outputs from CD modulator 14 and VD modulator 16 are provided to digital section 20 where they are filtered. Pressure and temperature data based on the filtered PCMP and PCMT signals is stored in digital section 20 for use by microprocessor 22 and for transmission through interface circuit 24.

Figure 2:
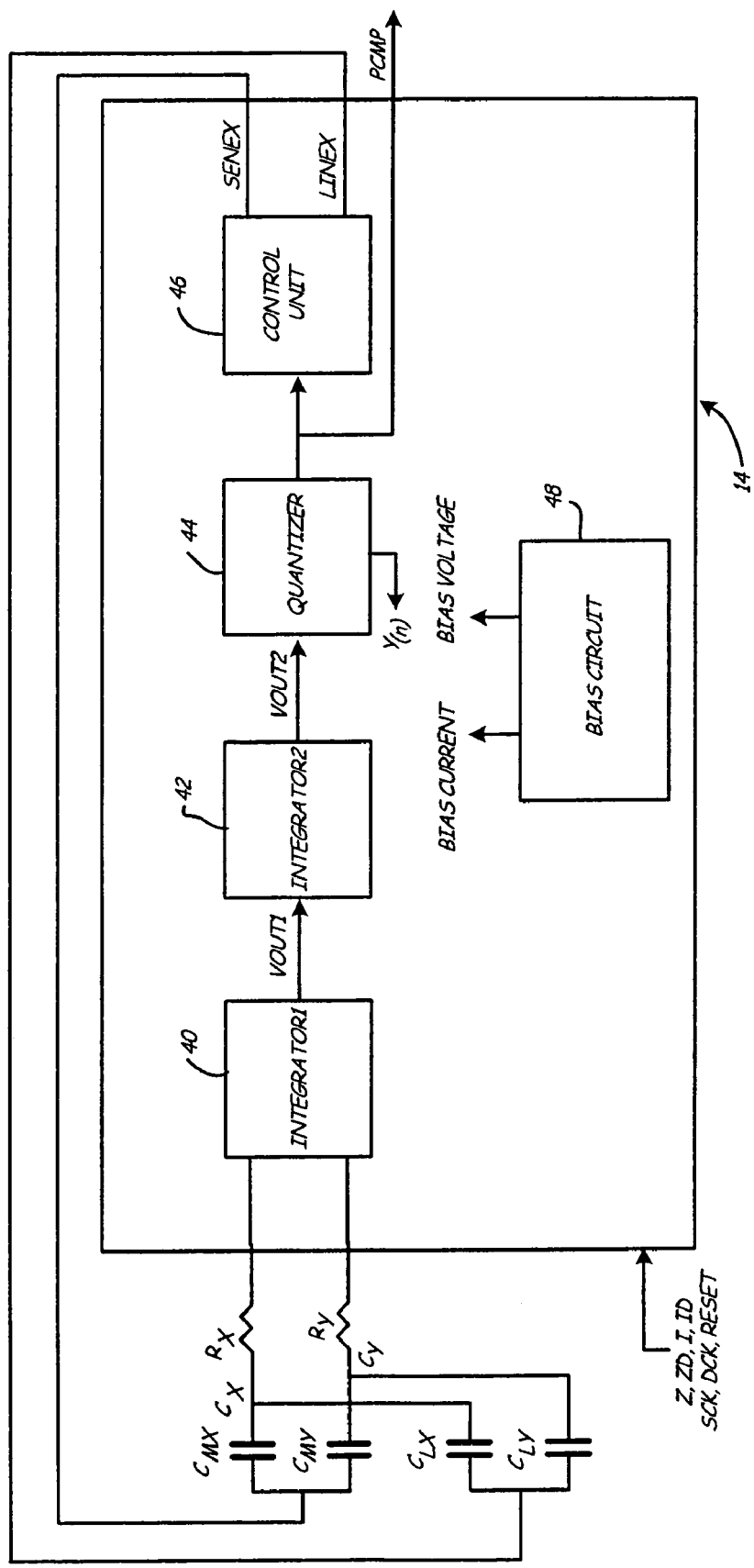
FIG. 2 is a block diagram of a capacitance-to-digital (CD) modulator of the transmitter of FIG. 1.

FIG. 2 shows a block diagram of CD modulator 14, which includes first stage integrator 40, second stage integrator 42, quantizer 44, control unit 46, and bias circuit 48. First stage integrator 40 is a sigma-delta integrator that produces a first stage output that is a function of capacitances $C_X$ and $C_Y$. Integrator 40 operates in an auto-zeroing mode during a first (or auto-zero) phase defined by the timing signals Z and ZD, where ZD is slightly delayed with respect to Z. Integrator 40 operates in an integration mode during a second (or integration) phase defined by the integration timing signals I and ID, where ID is slightly delayed with respect to I. The selection of which input ($C_X$ or $C_Y$) is connected to integrator 40 is based upon the state of output signal Y from quantizer 44.

Second stage integrator 42 is a sigma-delta integrator that samples the output of first stage integrator 40, and produces an output that is supplied to quantizer 44. Because first stage integrator 40 is not reset during the auto-zero phase, a two phase second order CD modulation is possible. Second stage integrator 42 performs its auto-zero and integration phases at the same time as first stage integrator 40, using the Z, ZD, I, and ID timing signals. In addition, second stage integrator 42 receives a reset signal.

The function of quantizer 44 is to convert the output signal of second stage integrator 42 to pulse code modulation signal PCMP, which is delivered to digital section 20. Quantizer 44 also provides signal Y, which is the inverse of signal PCMP. Y is used by CD control unit 46 and first stage integrator 40.

The main function of control unit 46 is to generate the SENEX signal and the LINEX signal. These signals are generated as a function of Y and the ZD and ID timing signals. The SENEX and LINEX signals are switched between a midlevel excitation voltage source VMID and a low side excitation voltage source VSSA. The LINEX signal is the inverse of the SENEX signal.

CD bias circuit 48 provides source current for the amplifiers of integrators 40 and 42 and the comparator of quantizer 44. It also generates bias voltages for the amplifiers, and provides a source current for the bias circuitry of VD modulator 16.

Figure 3:
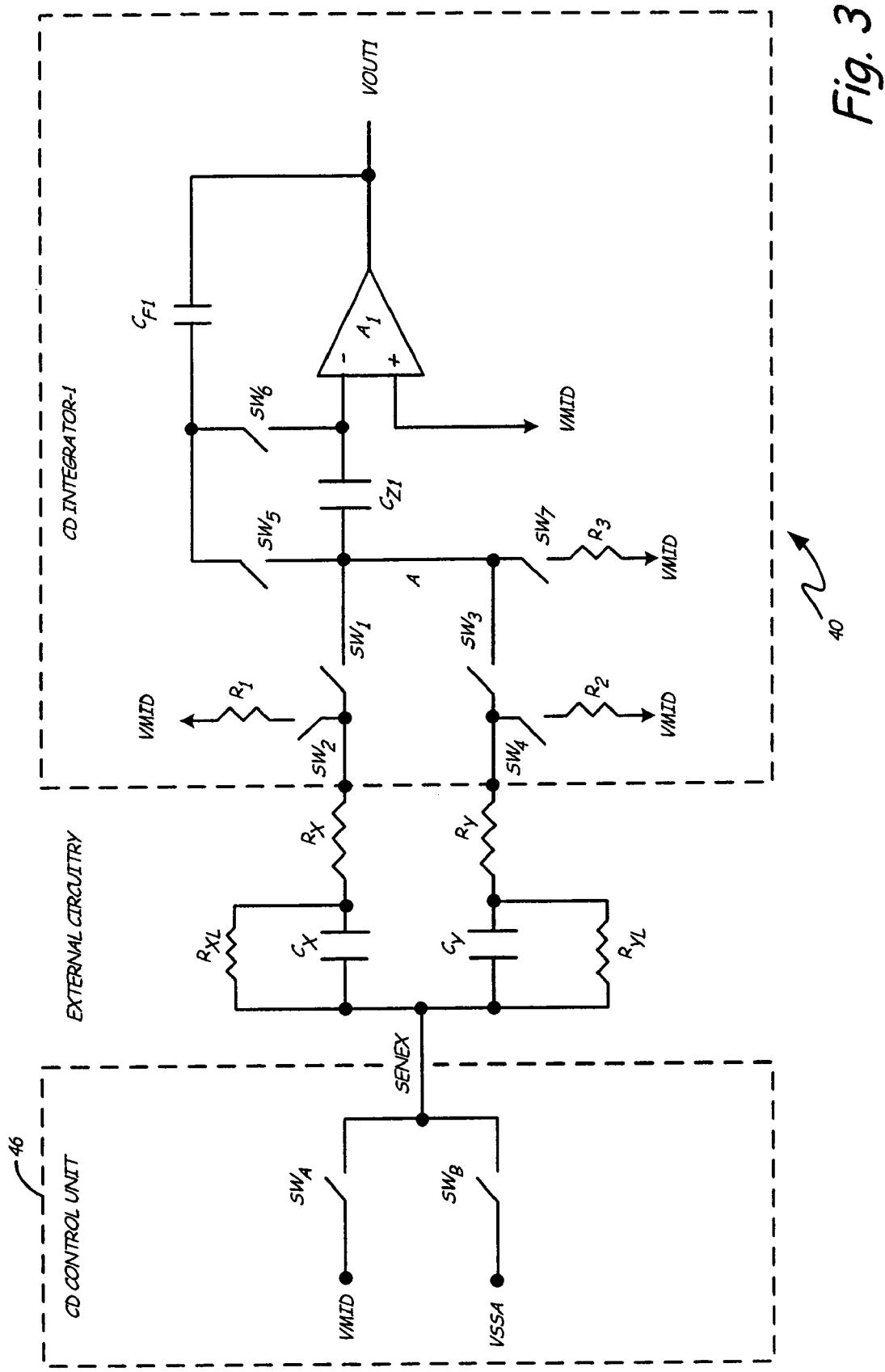
FIG. 3 is a schematic diagram of one embodiment of a first stage integrator of the CD modulator of FIG. 2.

FIG. 3 is a circuit schematic diagram of first stage integrator 40. Also shown in FIG. 3 are sensor capacitors $C_X$ and $C_Y$, leakage resistors $R_{XL}$ and $R_{YL}$, and resistors $R_X$ and $R_Y$, and a simplified diagram of CD control unit 46.

First stage integrator 40 includes amplifier $A_1$, feedback capacitor $C_{F1}$, auto-zero capacitor $C_{Z1}$, switches $SW_1$–$SW_7$ and on chip resistors $R_1$–$R_3$. In one embodiment, feedback capacitor $C_{F1}$ is 150 pF, auto-zero capacitor $C_{Z1}$ is 30 pF, resistors $R_1$ and $R_2$ are 10 kΩ each, and resistor $R_3$ is 4 kΩ.

The switch control signals for switches $S_1$–$S_7$, $SW_A$ and $SW_B$ are:

$SW_1=SW_4=Y$ $SW_2=SW_3=\overline{Y}$ $SW_5=I$ $SW_6=Z$ $SW_7=ZD$ $SW_A=Y \cdot ID + \overline{Y} \cdot ZD$ $SW_B=Y \cdot ZD + \overline{Y} \cdot ID$ The operation of first stage integrator 40 is as follows. During the auto-zero phase, switch $SW_5$ is off and switches $SW_6$ and $SW_7$ are on. The offset of amplifier $A_1$ is stored in capacitor $C_{Z1}$ without first stage integrator 40 being reset (i.e., without feedback capacitor $C_{F1}$ being discharged). At the same time, the sensor capacitor (either $C_X$ or $C_Y$) is charged or discharged.

In the case where Y is high, sensor $C_X$ is selected with its input node connected by $SW_1$ to common node A of integrator 40. With Y high and ZD high, switch $SW_B$ of CD control unit 46 is on and the SENEX signal applied to sensor $C_X$ is VSSA. As a result, a voltage drop is built across $C_X$, since integrator input node A of integrator 40 is connected through switch $SW_7$ and resistor $R_3$ to VMID.

In the case where Y is low, sensor $C_Y$ is connected by $SW_3$ to integrator input node A of integrator 40. In that case, switch $SW_A$ is on and $SW_B$ is off so that the SENEX node is connected to VMID. Voltage drop across $C_Y$ is zero, because switches $SW_3$ and $SW_7$ are closed and $C_Y$ has voltage VMID applied to both of its plates.

During the integration phase, switch $SW_5$ is on and switches $SW_6$ and $SW_7$ are off. Integrator 40 is in an integration mode.

In the case where Y is high, the SENEX node will have suddenly changed from VSSA to VMID as a result of switch $SW_B$ turning off and $SW_A$ turning on. A positive charge package is transferred from $C_X$ through $SW_1$ to integrator input node A of integrator 40. As a result, a negative voltage step is created at $V_{OUT1}$.

In the case where Y is low, the SENEX node is suddenly switched from VMID to VSSA. A negative charge package is transferred from $C_Y$ through $SW_3$ to integrator input node A. As a result, a positive voltage step is created at $V_{OUT1}$.

The excitation voltage $\Delta V_{EX}$ is the voltage difference between VMID and VSSA. The amount of charge transferred into first stage integrator 40 from $C_X$ or $C_Y$ in each operation can be expressed as $\Delta Q_X = C_X \cdot \Delta V_{EX}$ or $\Delta Q_Y = C_Y \cdot \Delta V_{EX}$ respectively. By denoting $N_0$ as the number $C_X$ operations, $N_1$ as the number $C_Y$ operations, and $N = N_0 + N_1$ as the total number of operations, the charge balancing equation for first stage integrator 40 can be written as:

$N_0 \cdot C_X \Delta V_{EX} - N_1 \cdot C_Y \Delta V_{EX} = 0.$

This gives the required measurement relation:

$$\frac{C_X - C_Y}{C_X + C_Y} = 2\frac{N_1}{N} - 1,$$

where the ratio $N_1/N$ is the pulse density of the PCMP signal.

Figure 4:
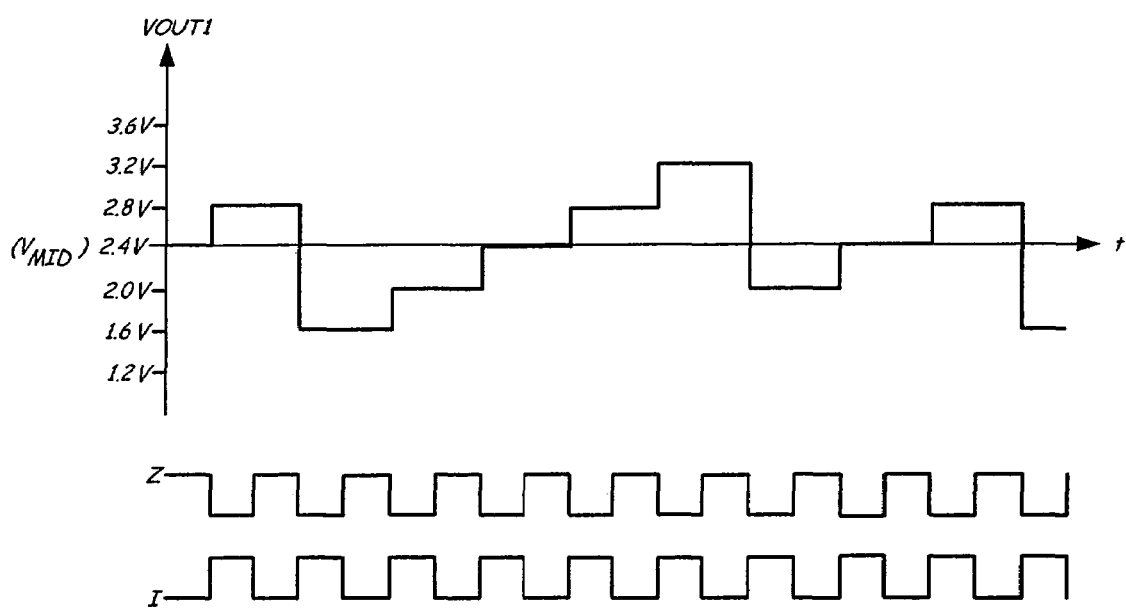
FIG. 4 is a diagram showing an example of $V_{OUT1}$, auto-zero (Z) and integration (I) signals of the first stage integrator of FIG. 3.

FIG. 4 shows an example waveform of $V_{OUT1}$ for first stage integrator 40, along with the auto-zero phase signal Z and the integration phase signal I. In this example, $C_X$=75 pF, $C_Y$=25 pF, $C_n$=150 pF, $C_Z$=30 pF, and VDDA=4.8V, VSSA=0 and VMID=2.4V.

As seen in FIG. 4, the output $V_{OUT1}$ of first stage integrator 40 is on hold during the auto-zero phase (when Z is high). In other words, $V_{OUT1}$ is not reset to zero during each auto-zero phase. This allows two phase second order operation, in which second stage integrator 42 uses the same auto-zero and integration phases as first stage integrator 40. As a result, the number of switches and control signals required for CD modulator 14 is reduced, circuit complexity and layout complexity is reduced, and the settling of integrators 40 and 42 is improved.

Figure 5:
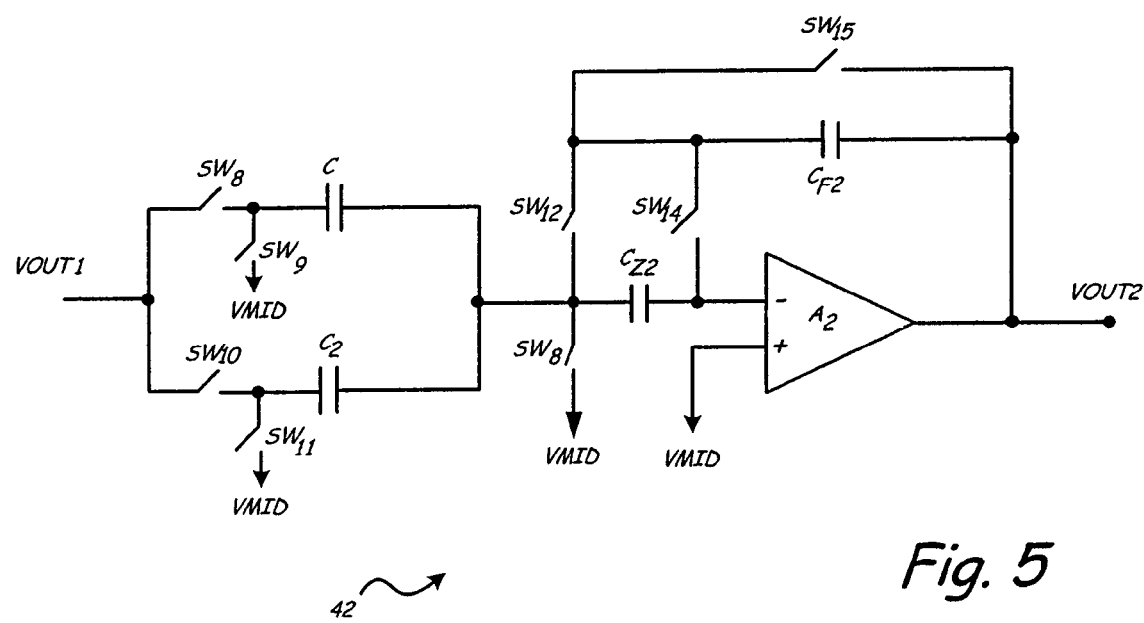
FIG. 5 is a schematic diagram of a second stage integrator of the CD modulator of FIG. 2.

FIG. 5 shows a circuit schematic diagram of second stage integrator 42, which includes amplifier 82, feedback capacitor $C_{F2}$, auto-zero capacitor $C_{Z2}$, two sampling capacitors $C_1$ and $C_2$, and switches $SW_8$–$SW_{15}$. In one embodiment, $C_{F2}$=40$_p$F, $C_Z$=10$_p$F, $C_1$=20$_p$F and $C_2$=10$_p$F.

The switch control signals for $SW_8$–$SW_{15}$ are:

$SW_8=SW_{11}=ID$ $SW_9=SW_{10}=ZD$ $SW_{12}=I$ $SW_{13}=Z$ $SW_{14}=ZD$ $SW_{15}=RESET$

Figure 6:
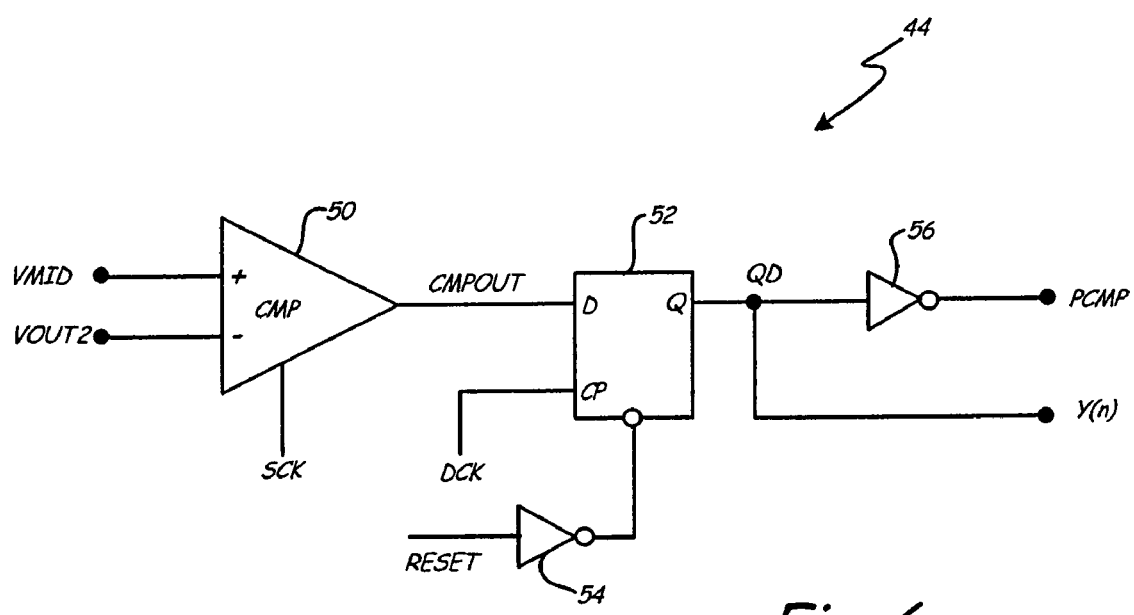
FIG. 6 is a schematic diagram of a quantizer of the CD modulator of FIG. 2.

FIG. 6 is a simplified circuit schematic of CD quantizer 44, which compares $V_{OUT2}$ to VMID and produces the pulse code modulated pressure signal PCMP as well as control signal Y. CD quantizer 44 includes comparator 50, D flip-flop 52 and inverters 54 and 56.

The positive input node of comparator 50 is connected to VMID, while the negative input node is connected to the output $V_{OUT2}$ of second stage integrator 42. Timing signal SCK provides an active low trigger for comparator 50.

D flip-flop 52 serves a synchronization purpose. It is triggered by the front edge of the DCK signal. That front edge is located between the falling edge of the integration phase timing signal ID and the rising edge of the auto-zero phase timing signal Z.

Two stage CD modulator 14 provides an automatic fold-back feature, without the need for a short circuit detector or other auxiliary circuitry in order to suppress the fold-back anomaly. Two cases need to be considered: $C_X$ side overpressure with a short circuit; and $C_Y$ side overpressure with a short circuit. In both cases, first stage integrator 40 prevents fold-back.

In the case of $C_X$ side overpressure together with a short circuit, auto-zero capacitor $C_{Z1}$ also serves as a short circuit adapter. During auto-zero phase, switches $SW_6$ and $SW_7$ are closed, and $SW_B$ is closed, applying VSSA to $C_X$. Current flows from VMID, through $R_3$ and $SW_7$ to node A, and through $SW_1$, $R_X$ and $R_{XZ}$ to VSSA. Due to the small leakage resistance $R_{XZ}$ across $C_X$ (i.e. a short circuit), the voltage at integrator input node A becomes much lower than VMID during the auto-zero phase. This lower voltage is sampled in the auto-zero phase, and is held by first integrator 40 in the integration phase.

During the integration phase, $SW_5$ is closed, $SW_6$ and $SW_7$ are open, and $SW_A$ is closed to apply VMID to $C_X$. The lower voltage at node A induces a current during the integration phase from VMID through $R_{XL}$, $R_X$, and $SW_1$ and $SW_5$ into $C_{F1}$. It is this induced current that keeps integrator 40 in saturation. As a result, no fold-back anomaly occurs.

In the case of $C_Y$ side overpressure with a short circuit, the voltage drop on $C_Y$ is discharged to zero in the auto-zero phase because it has VMID applied to both plates of $C_Y$ when Y is low and ZD is high. Therefore, the leakage resistor $R_{YL}$ across $C_Y$ has no effect on the voltage across $C_Y$. In the integration phase with Y low, the SENEX node is connected to VSSA. The short circuit across $C_Y$ will make integrator saturation even deeper, and no fold-back anomaly will occur.

In order to protect the VMID voltage source from an overpressure short circuit, resistors $R_1$–$R_3$ are provided in integrator 40 shown in FIG. 3. Resistor $R_1$ is placed between switch $SW_2$ and VMID. Resistor $R_2$ is placed between switch $SW_4$ and VMID. Resistor $R_3$ is placed between switch $SW_7$ and VMID. The values of the resistors are chosen in such a way that the average DC current leak from VMID to VSSA is always below 100 microamps. At the same time, the RC time constant is reasonably small, so that first stage integrator 40 will settle as required.

In order to demonstrate the automatic fold-back suppression, a simulation of circuit operation was performed using HSPICE software. The results are illustrated in FIGS. 7A and 7B and FIGS. 8A and 8B.

Figure 7A:
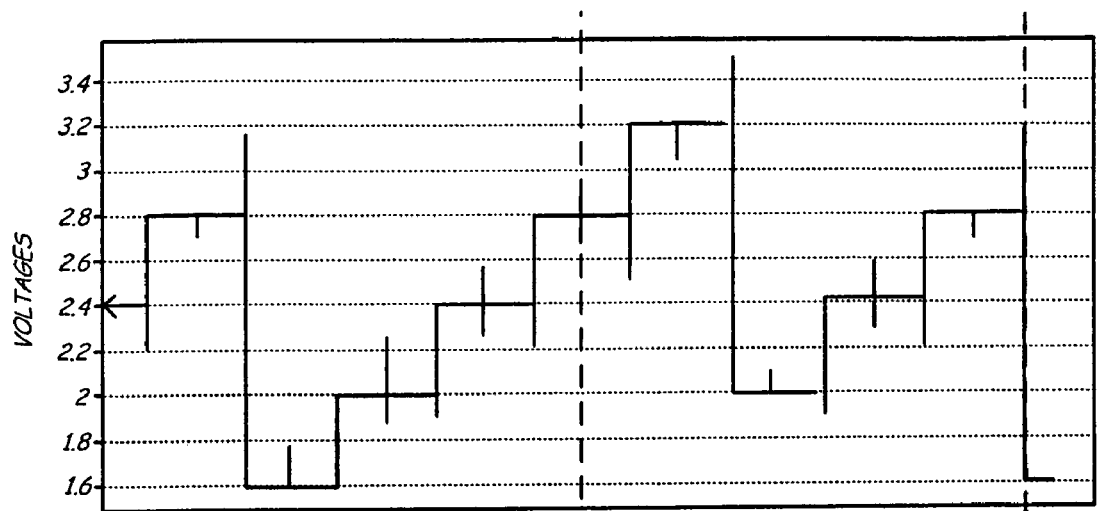
FIGS. 7A and 7B show waveforms of first stage output voltage $V_{OUT1}$ and pulse code modulation pressure signal PCMP from a computer simulation of normal operation of the CD modulator of FIGS. 2–6.
Figure 7B:
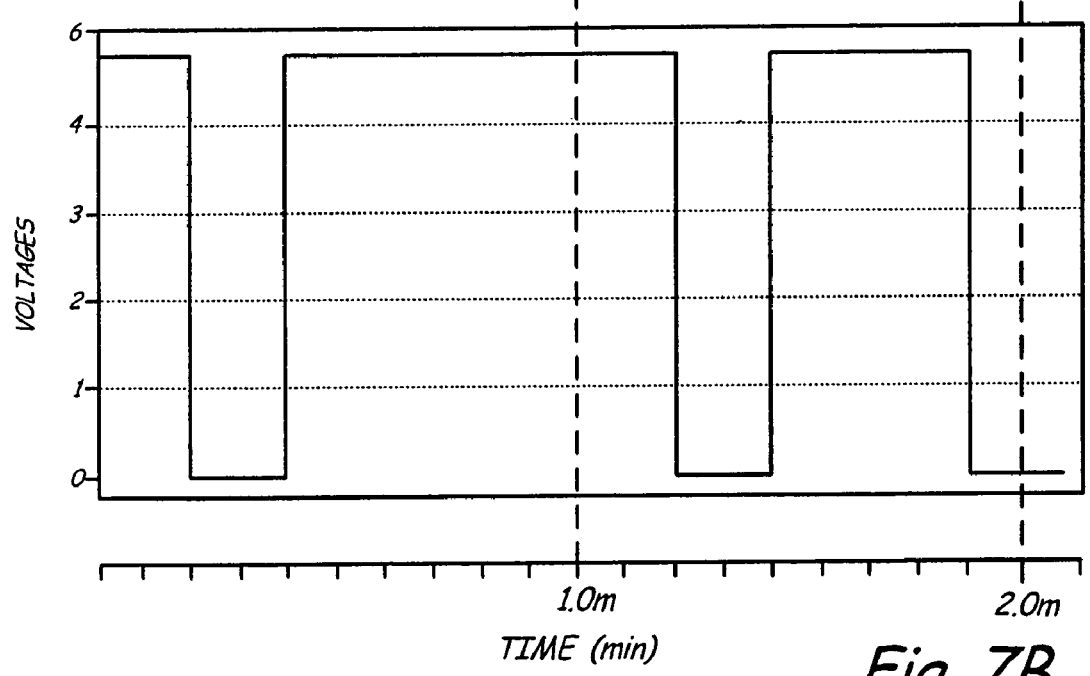

FIGS. 7A and 7B are an example of the operations of CD modulator 14 with a normal input. In this example, $C_X$=75 pF, $C_Y$=25 pF, $C_{F1}$=150 pF, $C_{Z1}$=30 pF, and VDDA=4.8V, VSSA=0 and VMID=2.4V. FIG. 7A shows a waveform of output $V_{OUT1}$ from first stage integrator 40. FIG. 7B shows corresponding pulse code modulation output signal PCMP.

Figure 8A:
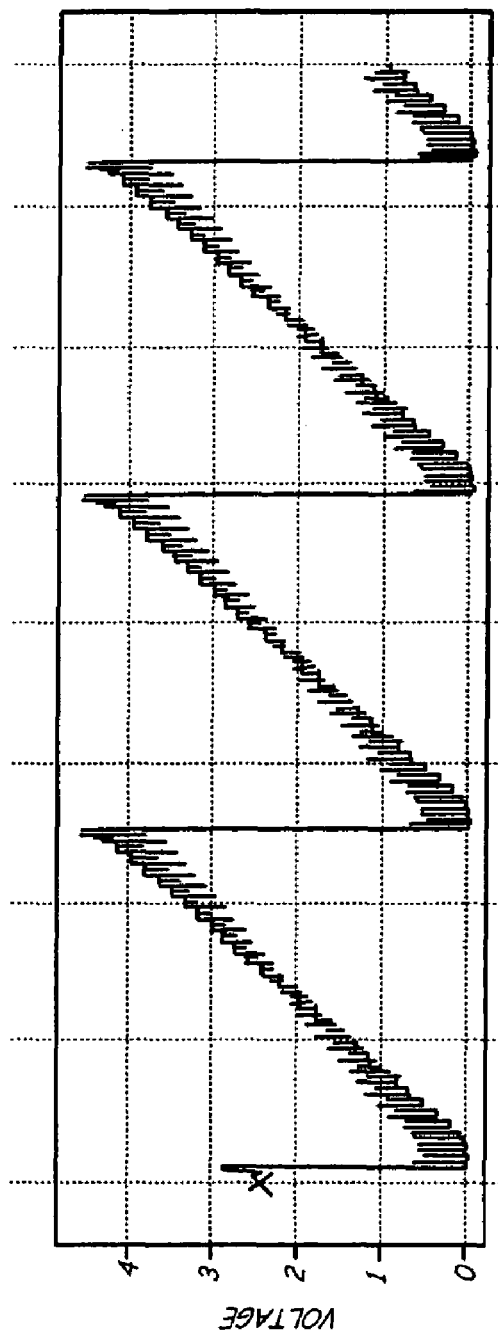
FIGS. 8A and 8B show waveforms of first stage output voltage $V_{OUT1}$ and pulse code modulation pressure signal PCMP from a computer simulation of overpressure/short circuit operation of the CD modulator of FIGS. 2–6.
Figure 8B:
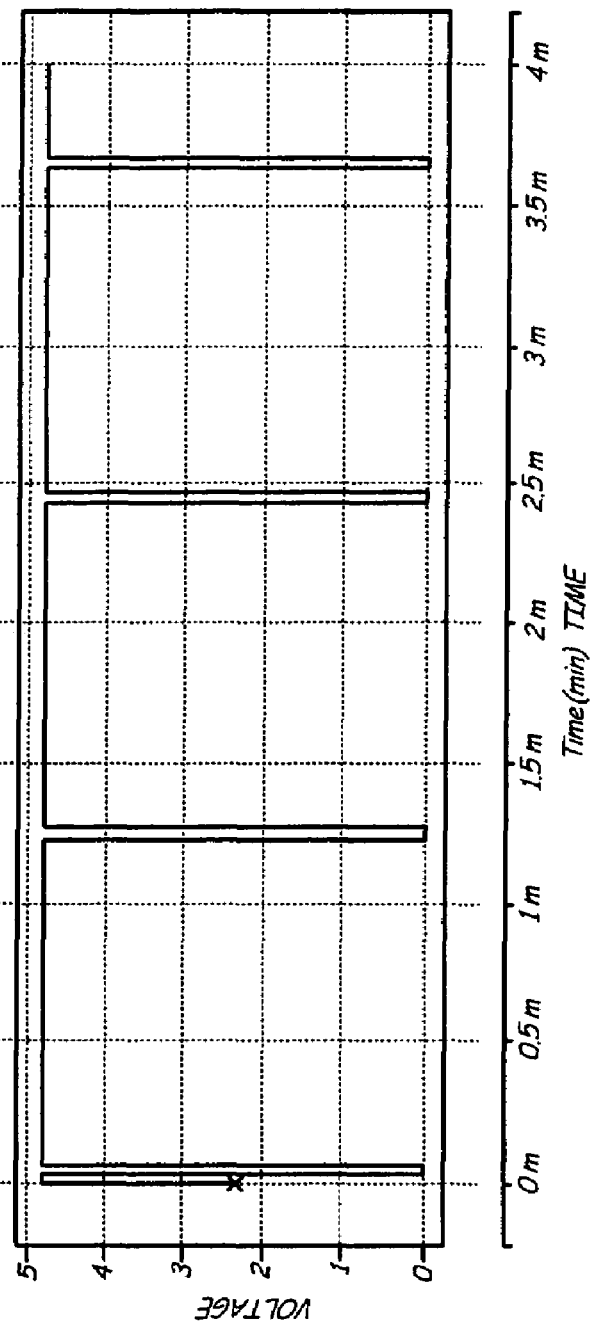

FIGS. 8A and 8B show an example in which X side overpressure and a short circuit have occurred. In this example, $C_X$=2,000 pF, $C_Y$=10 pF, $C_{F1}$=150 pF, $C_{Z1}$=30 pF, VDDA=4.8V, VSSA=0 and VMID=2.4V. The leakage resistor $R_{XL}$ across $C_X$ is 1 ohm, while the leakage resistor $R_{YL}$ across $C_Y$ is 1 Gohm. FIG. 8A is a waveform of output $V_{OUT1}$ of first stage integrator 40. FIG. 7B shows the waveform of the corresponding pulse code modulation output signal PCMP. As can be seen, despite the combined effects of X side overpressure and a short circuit, output signal PCMP indicates a high or overpressure condition.

Figure 9:
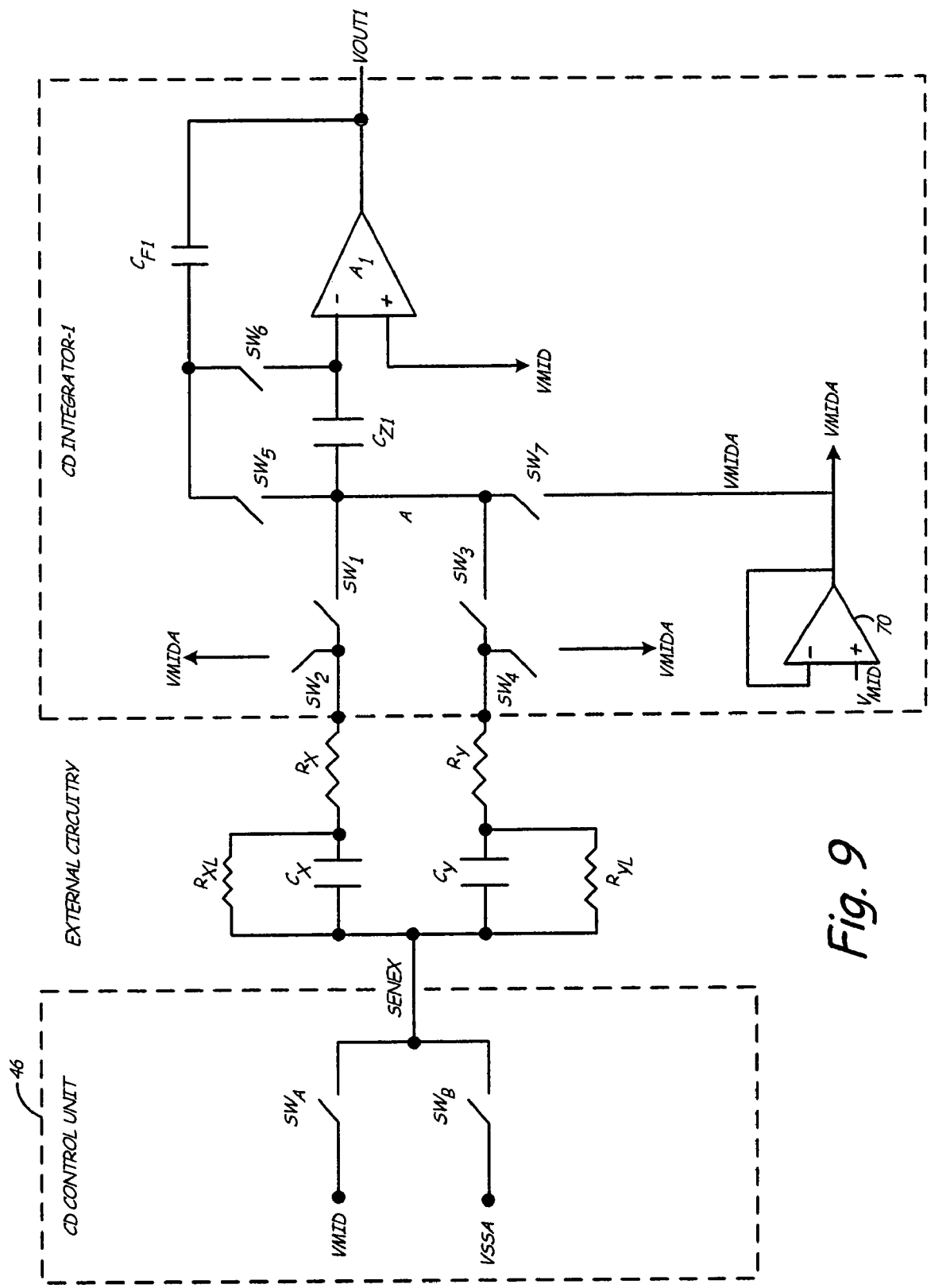
FIG. 9 is a schematic diagram of another embodiment of a first stage integrator of CD modulator of FIG. 2.

FIG. 9 shows another embodiment of first stage integrator 40', which is generally similar to the embodiment shown in FIG. 3, except that protection resistors $R_1$–$R_3$ have been replaced by operational transconductance amplifier (OTA) buffer 70, which converts midlevel supply voltage (VMID) to a variable voltage VMIDA that varies as a function of load resistance at the output of OTA buffer 70. The positive input of OTA buffer 70 is connected at VMID. The negative input and the output of OTA buffer 70 are connected together.

Figure 10B:
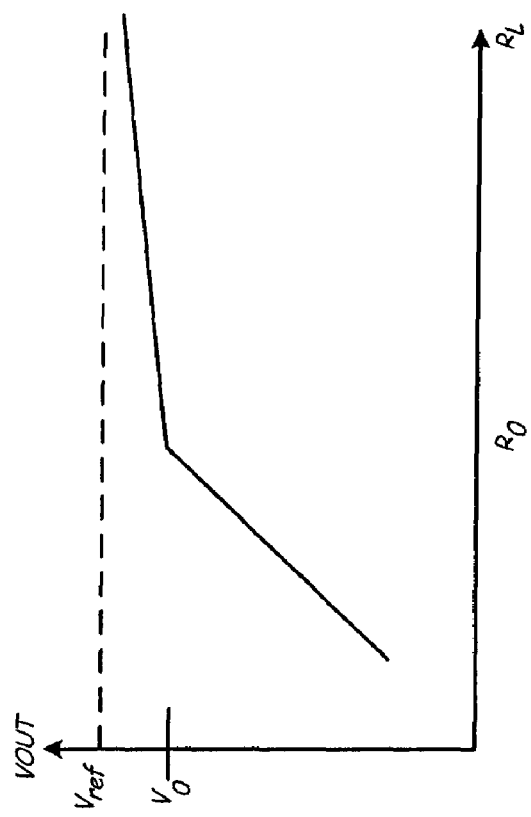
FIGS. 10A and 10B show output current and output voltage, respectively, as a function of load resistance for an operational transconductance amplifier (OTA) buffer.
Figure 10A:
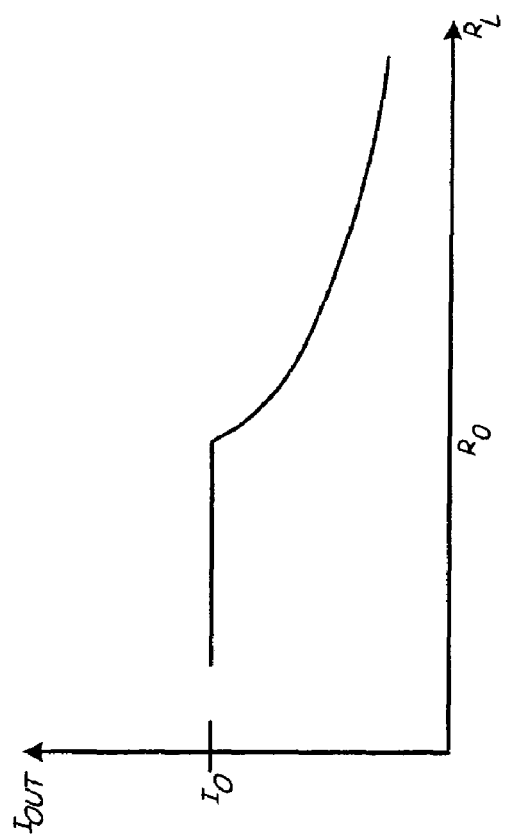

FIGS. 10A and 10B illustrate the output current and output voltage characteristics, respectively, of OTA buffer 70. In FIG. 10A, output current $I_{OUT}$ of OTA buffer 70 is shown as a function of load resistance $R_L$. In the region where load resistance $R_L$ is greater than characteristic resistance $R_O$, the buffer output current $I_{OUT}$ decreases as load resistance $R_L$ increases. The relationship is approximately $I_{OUT}$=$V_{REF}$/$R_L$. In the region where load resistance $R_L$ is less than $R_O$, the buffer output current $I_{OUT}$ remains a constant approximately. This constant current is equal to the maximum slew current $I_O$ of OTA buffer 70.

As shown in FIG. 10B, output voltage $V_{OUT}$ also varies as a function of load resistance $R_L$. In the region where load resistance $R_L$ is greater than $R_O$, output voltage $V_{OUT}$ of OTA buffer 70 is determined by the output current $I_{OUT}$ and the transconductance $G_M$ of OTA buffer 70. That is, $$V_{OUT} \approx V_{REF} + V_{OFFSET} - I_{OUT}/G_M.$$

In the region where load resistance $R_L$ is less than $R_O$, the buffer output voltage $V_{OUT}$ decreases as load resistance decreases:

$$V_{OUT} \approx I_{OUT} \cdot R_L.$$

The characteristic resistance value $R_O$ can be estimated by $R_O \approx V_{REF}/I_{OUT}$.

Under normal operating conditions without a short circuit, leakage resistance $R_{XL}$ of sensor capacity $C_X$ is very high. During the auto-zero phase, since the load resistance seen by OTA buffer 70 is $R_X+R_{XL}$ (and therefore is very high) buffer 70 serves as a constant voltage source. VMIDA at the output of buffer 70 differs from VMID by small offset.

The voltage difference VMIDA–VSSA is fully dropped across sensor capacitor of $C_X$ during the auto-zero phase, and a desired charge package is stored in sensor capacitor $C_X$. During the integration phase, an expected voltage step is created at the integrator output node during normal operation. In the case of overpressure without a short circuit, since the value of the input capacitor $C_X$ exceeds the value of feedback capacitor $C_{F1}$, integrator 40' becomes saturated.

During an abnormal operating condition involving an overpressure of $C_X$ with a short circuit, leakage resistance $R_{XL}$ across sensor capacitor $C_X$ is very small. During auto-zero phase, since the effective load resistance seen by OTA buffer 70 is much smaller than $R_O$, buffer 70 serves as a current source through switch $SW_1$, $R_X$, and $R_{XL}$ and switch $SW_B$ to voltage supply VSSA. The buffer output voltage VMIDA becomes lower than VMID. The lower buffer output voltage VMIDA causes a lower voltage at node A. The voltage difference between node A and the negative input of amplifier A1 is stored in auto-zero capacitor $C_{Z1}$.

During integration phase, due to the stored voltage in auto-zero capacitor $C_{Z1}$, a current is induced. This current flows from VMID, through $SW_4$, $R_{XL}$, $R_X$, $SW_1$, and $SW_5$ into feedback capacitor $C_{F1}$. It is this current that forces integrator 40' to be fully saturated.

In summary, with the embodiment shown in FIG. 9, during the auto-zero phase the leakage resistance $R_{XL}$ (an analog variable) is converted into an input node A voltage (another analog variable) and is stored in auto-zero capacitor $C_{Z1}$. During the integration phase, the voltage stored in auto-zero capacitor $C_{Z1}$ will control integrator operation. In the case of overpressure with a short circuit, integrator 40' will become saturated.

In order to demonstrate the automatic fold back suppression of the circuit shown in FIG. 9, a simulation of circuit operation was performed using HSPICE software. The results are illustrated in FIGS. 11A and 11B, 12A and 12B, and 13A and 13B.

Figure 11A:
FIGS. 11A and 11B show a computer simulation of output current and output voltage characteristics of the OTA buffer used in the first stage integrator of FIG. 9.
Figure 11B:
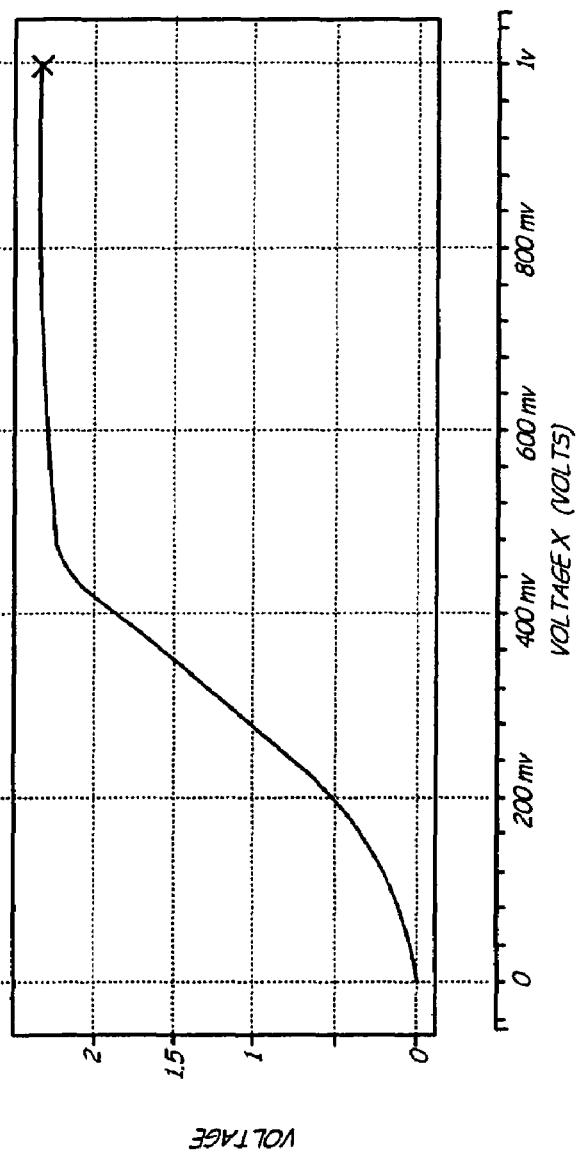

FIGS. 11A and 11B show the HSPICE simulation results of the characteristics of OTA buffer 70 with a variable resistance load. FIG. 11A shows output current, and FIG. 11B shows output voltage.

In the simulation results shown in FIGS. 11A and 11B, the supply of the buffer circuit is 4.8V, and the reference input VMID is 2.4V. In this simulation, a linear voltage control load resistor is employed. That is, when the control voltage is 1 $V_C$, the load resistor value is 100K. When the control voltage is 500V, the load resistor value is 50K. The characteristic load resistance in the simulation was $R_O$=45.4K.

FIG. 11A shows output current $I_{OUT}$ as a function of the control voltage $V_C$. In the region $R_L$ is less than $R_O$, the output current is close to a constant (about $58_{\mu A}$). In the region where load resistance $R_L$ is greater than the characteristic load resistance $R_O$, the output current decreases as $R_L$ increases.

FIG. 11B shows output voltage $V_{OUT}$ versus the control voltage $V_C$. In the region where load resistance $R_L$ is less than characteristic load resistance $R_O$, the output voltage $V_{OUT}$ decreases as load resistor value (control voltage) decreases. In the region where load resistance $R_L$ exceeds characteristic load resistance $R_O$, the buffer output voltage $V_{OUT}$ is close to a constant.

FIGS. 12A and 12B show the HSPICE simulation results of a CD modulator without anti-foldback circuitry. FIG. 12A shows waveform of output voltage $V_{OUT1}$ representing the output of first stage integrator 40'. FIG. 12B shows a waveform of the PCMP output signal.

In this simulation, the input sensor capacitance size is $C_X$=2,000 pF and $C_Y$=10 pF. The leakage resistor for the X side is $R_{XL}$=500 ohm, and for the Y side $R_{YL}$=100 Gohm. The input series resistor $R_X$ and $R_Y$ are 12.1K.

Based upon the input, the calculated capacitance ratio for this simulation is above 0.90. However, based upon the PCMP signal, the capacitance ratio produced by the CD modulator is about 0.65. This illustrates the inaccuracy produced by fold-back anomaly.

FIGS. 13A and 13B show the HSPICE simulation results of the two phase CD modulator with the anti-foldback feature using OTA buffer 70 as shown in FIG. 9. FIG. 13A shows the output of first stage integrator 40', while FIG. 13B shows the waveform of the PCMP output signal.

For the simulation shown in FIGS. 13A and 13B, the capacitances are $C_X$=2,000 pF and $C_Y$=10 pF. The leakage resistors are $R_{XL}$=500 ohms and $R_Y$=100 Gohm. The input series resistors $R_X$ and $R_Y$ are 12.1K. Thus the capacitance and resistance values are the same as used for the simulation in FIGS. 12A and 12B. The OTA characteristics used for buffer 70 are the ones shown in FIGS. 11A and 11B.

Based upon the input, the calculated capacitance ratio is above 0.90. Based on the PCMP signal shown in FIG. 13B, capacitance ratio reading is about 0.90. Thus, the fold-back anomaly has been suppressed.

Although the present invention has been described with reference to preferred embodiments, workers skilled in the art will recognize that changes may be made in form and detail without departing from the spirit and scope of the invention.

The invention claimed is:

1. A two-phase, second order capacitance-to-digital (CD) modulator for converting a first capacitance $C_X$ and a second capacitance $C_Y$ to a pulse code modulated (PCM) signal representative of $(C_X-C_Y)/(C_X+C_Y)$, the CD modulator comprising:
   a first stage sigma-delta integrator for selectively forming charge packets in $C_X$ and $C_Y$ during a first phase, and integrating charge from $C_X$ and $C_Y$ during a second phase to produce a first stage output $V_{OUT1}$, wherein the first stage sigma-delta integrator holds $V_{OUT1}$ constant during the first phase;
   a second stage sigma-delta integrator for sampling the first stage output $V_{OUT1}$ during the first phase, and integrating the sampled first stage output during the second phase to produce a second stage output $V_{OUT2}$; and
   a quantizer for converting the second stage output $V_{OUT2}$ to the PCM signal.

2. The CD modulator of claim 1 and further comprising:
   a CD control unit for selectively providing an excitation signal to the first capacitance $C_X$ and second capacitance $C_Y$ as a function of the PCM signal.

3. The CD modulator of claim 2 wherein the first stage sigma-delta integrator comprises:
   an integrator input node;
   an amplifier having a first input, a second input and an output;
   an auto-zero capacitor connected between the integrator input node and the first input of the amplifier;
   a feedback capacitor connected to the output of the amplifier; and
   a switching circuit for connecting $C_X$ to the integrator input node when the PCM signal has a first state and $C_Y$ to the integrator input node when the PCM signal has a second state, for connecting the feedback capacitor to the first input during the first phase, and for connecting the feedback capacitor to the common node during the second phase.

4. The CD modulator of claim 3 wherein the auto-zero capacitor stores a voltage that is a function of leakage resistance of $C_X$ or $C_Y$ during the first phase.

5. The CD modulator of claim 4, wherein the voltage stored by the auto-zero capacitor during the first phase causes the first stage integrator to saturate during the second phase if $C_X$ is exposed to overpressure and is exhibiting a short circuit condition.

6. The CD modulator of claim 3 wherein the excitation signal switches between a first supply voltage level and a second supply voltage level as a function of the PCM signal states and the first and second phases.

7. The CD modulator of claim 6 wherein the second input of the amplifier is connected to receive the first supply voltage level.

8. The CD modulator of claim 7 wherein the switching circuit connects $C_X$ to the first supply voltage level through a first protection resistance when the PCM signal is in the first state, connects $C_Y$ to the first supply voltage level through a second protection resistance when the PCM signal is in a first state, and connects the integrator input node through a third protection resistance to the first supply voltage level during the first phase.

9. The CD modulator of claim 1 wherein the second stage sigma-delta integrator is resettable in response to a reset signal.

10. A two-phase, second order capacitance-to-digital (CD) modulator comprising:
    a first stage sigma-delta integrator for selectively forming charge packets as a function of sensor capacitance during an auto-zero phase, and integrating the charge packets during an integration phase to produce a first stage output $V_{OUT1}$ that changes only in the integration phase;
    a second stage sigma-delta integrator for sampling the first stage output $V_{OUT1}$ during the auto-zero phase, and integrating the sampled first stage output during the integration phase to produce a second stage output $V_{OUT2}$; and
    a quantizer for converting the second stage output $V_{OUT2}$ to a pulse code modulated signal.

11. The CD modulator of claim 10 and further comprising:
    a CD control unit for providing an excitation signal to produce the charge packets as a function of the PCM signal.

12. The CD modulator of claim 10 wherein the first stage sigma-delta integrator comprises:
an integrator input;
an amplifier having a first input, a second input and an output;
an auto-zero capacitor connected between the common node and the first input of the amplifier; and
a feedback capacitor connected to the output of the amplifier.

13. The CD modulator of claim 12 wherein the auto-zero capacitor stores a voltage that is a function of sensor leakage resistance during the auto-zero phase.

14. The CD modulator of claim 13 wherein the voltage stored by the auto-zero capacitor during the auto-zero phase causes the first stage sigma-delta integrator to saturate during the integration phase in an overpressure and short circuit condition.

15. A differential pressure transmitter comprising:
a first capacitance pressure sensor;
a second capacitance pressure sensor;
a first stage sigma-delta integrator for selectively forming charge packets as a function of capacitance of one of the first and second capacitance pressure sensors during a first phase, and integrating charge during a second phase to produce a first stage output $V_{OUT1}$, wherein the first stage output $V_{OUT1}$ is not reset between successive second phase periods;
a second stage sigma-delta integrator for sampling the first stage output $V_{OUT1}$ during the first phase, and integrating the sampled first stage output during the second phase to produce a second stage output $V_{OUT2}$; and
a quantizer for converting the second stage output $V_{OUT2}$ to a pulse code modulated (PCM) signal that is a function of pressure sensed by the first and second capacitance pressure sensors.

16. The differential pressure transmitter of claim 15 and further comprising:
an integrator input node;
an amplifier having a first input, a second input and an output;
an auto-zero capacitor connected between the integrator input node and the first input of the amplifier;
a feedback capacitor connected to the output of the amplifier; and
a switching circuit for connecting the first capacitance pressure sensor to the integrator input node when the PCM signal has a first state and the second capacitance pressure sensor to the integrator input when the PCM signal has a second state, for connecting the feedback capacitor to the first input during the first phase, and for connecting the feedback capacitor to the integrator input node during the second phase.

17. The differential pressure transmitter of claim 16 wherein the excitation signal switches between midlevel supply voltage and a low level supply voltage as a function of the PCM signal states and the first and second phases.

18. The differential pressure transmitter of claim 17 wherein the second input of the amplifier is connected to receive the midlevel supply voltage.

19. The differential pressure transmitter of claim 16 wherein the auto-zero capacitor stores a voltage that is a function of sensor leakage resistance during the first phase.

20. The differential pressure transmitter of claim 19 wherein the voltage stored by the auto-zero capacitor causes the first stage sigma-delta integrator to saturate during the integration phase if an overpressure and short circuit condition exists.

* * * * *

UNITED STATES PATENT AND TRADEMARK OFFICE
CERTIFICATE OF CORRECTION

PATENT NO. : 7,324,029 B2
APPLICATION NO. : 11/339890
DATED : January 29, 2008
INVENTOR(S) : Rongtai Wang It is certified that error appears in the above-identified patent and that said Letters Patent is hereby corrected as shown below:

On the title page item (73), under Assignee delete "Emerson Process Management, Eden Prairie, MN (US)", insert --Fisher-Rosemount Systems, Inc., Austin, TX (US)--

Column 8, Line 9,

Delete "$V_{OUT} \approx {}_{IOUT} \cdot \boldsymbol{R_L}$"

Insert -- $V_{OUT} \approx \boldsymbol{I_{OUT}} \cdot \boldsymbol{R_L}$ --

Signed and Sealed this

Twelfth Day of August, 2008

JON W. DUDAS
*Director of the United States Patent and Trademark Office*